United States Patent
Wu et al.

(10) Patent No.: US 7,100,134 B2
(45) Date of Patent: Aug. 29, 2006

(54) METHOD AND PLATFORM FOR INTEGRATED PHYSICAL VERIFICATIONS AND MANUFACTURING ENHANCEMENTS

(75) Inventors: Shao-Po Wu, Portola Valley, CA (US); Tsz-Tak Daniel Ho, Palo Alto, CA (US)

(73) Assignee: Aprio Technologies, Inc., Palo Alto, CA (US)

( * ) Notice: Subject to any disclaimer, the term of this patent is extended or adjusted under 35 U.S.C. 154(b) by 159 days.

(21) Appl. No.: 10/643,799

(22) Filed: Aug. 18, 2003

(65) Prior Publication Data

US 2005/0044514 A1 Feb. 24, 2005

(51) Int. Cl.
G06F 9/45 (2006.01)
G06F 17/50 (2006.01)

(52) U.S. Cl. .................. 716/5; 716/11; 716/19
(58) Field of Classification Search ............... 716/1–21
See application file for complete search history.

(56) References Cited

U.S. PATENT DOCUMENTS

| | | | | |
|---|---|---|---|---|
| 5,208,765 | A * | 5/1993 | Turnbull ................. | 702/84 |
| 5,497,334 | A * | 3/1996 | Russell et al. ............ | 716/5 |
| 5,705,301 | A | 1/1998 | Garza et al. | |
| 5,858,580 | A | 1/1999 | Wang et al. | |
| 6,009,251 | A | 12/1999 | Ho et al. | |
| 6,063,132 | A * | 5/2000 | DeCamp et al. .......... | 716/5 |
| 6,099,584 | A | 8/2000 | Arnold et al. | |
| 6,230,299 | B1 | 5/2001 | McSherry et al. | |
| 6,269,472 | B1 | 7/2001 | Garza et al. | |
| 6,282,696 | B1 | 8/2001 | Garza et al. | |
| 6,370,679 | B1 | 4/2002 | Chang et al. | |
| 6,378,110 | B1 | 4/2002 | Ho | |
| 6,415,421 | B1 | 7/2002 | Anderson et al. | |
| 6,425,112 | B1 | 7/2002 | Bula et al. | |
| 6,470,489 | B1 | 10/2002 | Chang et al. | |
| 6,505,328 | B1 | 1/2003 | Van Ginneken et al. | |
| 6,725,435 | B1 * | 4/2004 | Cote et al. ............... | 716/5 |
| 6,789,246 | B1 * | 9/2004 | Mohan et al. ............ | 716/11 |
| 6,807,663 | B1 * | 10/2004 | Cote et al. ............... | 716/21 |
| 6,898,770 | B1 * | 5/2005 | Boluki et al. ............. | 716/6 |
| 2003/0182643 | A1 * | 9/2003 | Crouse et al. ............ | 716/5 |
| 2004/0181769 | A1 * | 9/2004 | Kochpatcharin et al. ... | 716/19 |
| 2005/0034088 | A1 * | 2/2005 | Hamlin ................... | 716/4 |

* cited by examiner

Primary Examiner—Vuthe Siek
Assistant Examiner—Nghia M. Doan
(74) Attorney, Agent, or Firm—Fenwick & West LLP

(57) ABSTRACT

An automated design for manufacturability platform which provides integrated physical verification and manufacturing enhancement operations. The platform uses an efficient data structure capable of handling and manipulating both layout circuit and geometry characteristics, which permits a wide range of operations such as timing analysis, design-rule checking and optical proximity corrections on a single platform. This feature eliminates the need to translate layout representations between various tools without the requirement of using a common database. Moreover, the platform's common user interface enables encapsulated information exchange between the design and the manufacturing teams, permiting early consideration of manufacturing distortion or enhancement impact on circuit performance.

1 Claim, 5 Drawing Sheets

METHOD AND PLATFORM FOR INTEGRATED PHYSICAL VERIFICATIONS AND MANUFACTURING ENHANCEMENTS

FIELD OF INVENTION

The present invention relates to circuit design, schematic verification and making of photomasks prior to manufacture of integrated circuits. More specifically, the present invention is directed to automated digital logic synthesis and placement systems and enhancements for manufacturability, yield and performance which allow the device designer and the IC manufacturer to collaborate on optimizing the circuit design, device layout and manufacturing yields prior to making of the masks.

BACKGROUND OF INVENTION

In the prior art, the process of designing an integrated circuit on a typical CAD system is done in several discrete steps using different software tools and data bases. Once specifications for the IC are in place, the circuit for the product is designed, typically using a synthesis tool, followed with verification of the design using logic simulation tools and formal verification tools to ensure the resulting logical representation of the circuit is equivalent to the schematic and the original product design specifications for both performance criteria and logic correctness criteria.

The next stage for the circuit implementation is to convert the logical and schematic representation to a physical representation that will be produced on silicon. This physical representation is the placement of the various circuit elements in the manner in which they will appear on the silicon chip; this is commonly referred to as "laying out the device". The physical layout is specified in terms of a multiplicity of layers used to fabricate the integrated circuit. The layout is a set of geometric polygons that is imprinted on silicon during the lithographic portion of the manufacturing process. A layout contains the different layers of polygons, each layer representing a different process step to form the logic gates, interconnects, and other circuit elements as described by the final schematic. A layout may also contain cells, which are structures of polygons grouped together in the same or different layers. A cell may be replicated many times within a layout but only one instance of it is stored, with the variance of it represented by the geometric orientation. The handling of cell arrangements and the methods of manipulating and storing them is called the hierarchy handling strategy.

At the lowest level, the most basic cells contain simple geometric shapes, rectangles and polygons. In order to generate a physical mask, the hierarchical data must first be flattened, enumerating every geometric figure described in the hierarchy. Flattening the hierarchy typically results in several orders of magnitude increase in the size of data storage required to represent the pattern.

After the physical representation, the layout is generated; many software tools are used to perform analysis to ensure correct mapping between logical and physical representation (Layout Versus Schematic, LVS tool), satisfaction of performance specifications such as timing (Timing analysis tool), power (Power analysis tool), and signal integrity (Signal integrity analysis tool), checking of design rules, vendor specific geometric rules such as minimum width rules to check the minimum size of a polygon, minimum spacing rules to check minimum spacing between polygons, overlap and extension rules to check overlapping and extensions of intersection polygons, and a Design rule checker, DRC), etc. Should the analyses performed identify violations of the design or performance specifications, the circuit designer has to make changes to either the logical representation or physical representation to correct the problems and to modify the layout such that the requirements are satisfied. When a designer decides that the layout satisfies all requirements, the desired layout, at this point referred to as the tape-out, is sent to the manufacturing group for fabrication of the photo masks required for integrated circuit production.

When the manufacturer receives the "taped-out layout", a design rule check on the layout is performed first to ensure that the layout does not violate any design rules of the particular manufacturer. It is common for different manufacturers, or foundries, to have different design rules based upon the given production tools and processes employed at that site. After the design rule check, DRC, typically for advanced semiconductor manufacturing processes which employ feature sizes of 0.18 microns or smaller, a manufacturer will apply layout enhancement functions such as optical proximity correction, phase shifting, dummy fill generations, etc., to modify the layout in an attempt to produce patterning on the silicon as close to the optimal feature size as possible. After this process, the physical data required to represent the resulting layout is again expanded and may exceed ten times the data volume of the original taped-out layout. After this initial DRC, a manufacturer will perform additional design rule checking on the modified layout to verify that all design rules, including additional rules for the enhancement features introduced, are still satisfied. This checking for rule violations may require more than one iteration, occasionally three or four. After the final check, the manufacturer will use the "final" layout to generate a set of masks ready for integrated circuit production.

In the conventional scheme for proceeding from circuit design to mask production, the designer designs his layout without considering the enhancements or modifications required by the particular manufacturer who is going to perform the IC production. Similarly, a manufacturer applies his particular layout modifications without re-verifying the circuit characteristics. As illustrated in FIGS. 2A and 2B, it is well known that any layout modifications by a manufacturer will impact the electrical characteristics of the circuit, thus affecting the performance and functionalities of the circuit. Therefore, the current design to production process is flawed or suboptimal at best. Problems may not be detected until the integrated circuit is being manufactured or worse, when it is being final tested, resulting in wasted time and money.

As described herein, many software tools are utilized to verify and enhance the layouts. These tools come from many different vendors, such as Cadence, Synopsys, Mentor Graphics, Magma, etc. The design and verification tools frequently do not share a common database to facilitate the exchange of data and information. There is also no universal data format which encompasses the representation of data in this vast array of software tools. While there are many initiatives, such as Open Access from Cadence and Milky-Way from Synopsys, to encourage the use of a common database, it is not practical to expect all legacy and future tools to converge to a single standard, since each tool performs different functions and requires its own data model. Furthermore, a system which merely integrates design rule checkers, LVS, and layout enhancement operations, such as described in U.S. Pat. No. 6,415,421, does not help designers to consider layout enhancement effects at the design stage as it lacks the interface to various physical verification tools for performance criteria such as timing, power, signal integrity, etc., and does not help manufacturers to re-verify the electric circuit characteristics after layout enhancement as it does not carry the necessary performance and design criteria into the manufacturing stage.

FIG. 1 illustrates the prior art, a conventional process executed by computer system for creating circuit representations, verifying and predicting their performance on silicon, checking design rules for manufacturability, adding various layout enhancements to facilitate the manufacturing processes, and prepare final layout data for mask making. The process begins in this example at the placement and the routing of the circuit (step 11), where a set of complex circuit representations are being assembled. For example, one such complex layout may comprise nets, cells, functional blocks, various circuit layers, such as metal, polysilicon, diffusion, contact, via, transistor gates . . . , etc. Next, the process performs various verification operations (step~12) to attempt to predict circuit performance on silicon and to identify a set of critical paths where circuit performance requirements may be in jeopardy. The next step (step 15) in the process is to check the layout against a set of pre-determined worst-case geometric rules (design rules) provided by the manufacturers to ensure manufacturability. Once all physical verifications are passed, the layout is taped-out from the design facility to the manufacturing facility. The first step in the manufacturing data preparation process (step 16) is another design-rule check and some manufacturing-specific layout pre-conditioning process, such as separating the layers and layer biasing/sizing. The next two steps (step~17 and 18) in the process add to the layout various resolution enhancement features (see below). The layout is then prepared and translated into mask data format (step 10) in preparation for mask making.

FIGS. 2A and 2B illustrates an example of manufacturing-specific layout enhancements applied to metal interconnections. FIG. 2A shows the appearance of a layout portion defining five adjacent metal wires, where in region 21 the wires are densely packed and in region 22 there is only one isolated wire. According to prior practices, due to various proximity effects of the silicon manufacturing process, various layout enhancements may be applied to reduce these proximity effects hence ensure manufacturability and yield. FIG. 2B shows an example of such enhancement applications, where region 23 shows "additive" optical proximity correction, region 24 shows "dummy" fill patterns used to equalize the area pattern density, and region 25 shows "subtractive" optical proximity correction. It is well understood that these enhancement features create impacts not only on the manufactured silicon patterns but also on the circuit electric characteristics. In this example, enhancement 23, 24 and 25 slows down the signal propagation speed on the center wire hence causes longer delay than what designers can predict from the original layout shown in FIG. 2A.

The major dilemma presented in this conventional flow is that manufacturing-specific layout enhancements (FIG. 1, step 17 and 18) are required to ensure manufacturability; however, they do impact circuit electric characteristics hence should be considered early in physical verification (step 12). On the other hand, no design-related information is available to be used to optimally generate these enhancements and verify their correctness. This disconnect between the design and the manufacturing entities result in less-than-optimal yield and performance in the manufactured integrated circuit, especially for integrated circuits designed for and manufactured by advanced sub-0.20 micron technology.

Therefore, an improved method of layout and verification is needed to resolve these issues.

U.S. Pat. No. 6,415,421 represents a partial solution in an attempt to solve the disconnect problem. By using one program encompassing DRC, OPC and other possible layout enhancement operations utilizing a common data-structure and database, the invention attempts to enhance the integration and communication in-between various geometric verification and enhancement operations. However, the invention cannot be extended to link the circuit design and verification tools to effectively close the communication disconnect between the design and the manufacturing groups. In addition, the proposed solution is handicapped by its own requirements for a common data-structure and database. Furthermore, the (421) approach is deficient because it does not include design-for-manufacturing tools; neither does it teach the concept of optimizing across all requirements, design and process, prior to mask making.

SUMMARY OF INVENTION

The present invention has been made considering the above problems of the prior art. This invention bridges the disconnect between the design and manufacturing groups so that they can interact effectively, using a single platform without the need of a common database, to optimize the performance and manufacturability of the integrated circuit. Should a common database exist this invention will optimize performance as well based on the same principles. This method comprises accessing a corrected design and generating a simulated image. The simulated image can then be used by the design rule checker. The circuit must be translated into a physical representation, in a condensed hierarchical fashion such as a GDS-II file, Gerber Data Structure. Other examples of physical representation formats are LEF, DEF, Netlist and MEBES. The invention employs a novel approach of unifying the interfaces in-between users and engines, and engines and data-structures so that each of these "components" can interact with each other through the invented interface.

To implement the improved flow, it is clear that there is a need to access layout enhancement generation capability early in physical verification FIG. 3, step 13, and to access detailed circuit performance verification capability late in manufacturing data preparation, FIG. 3, step 19. Moreover, information related to enhancement generation, such as proximity models, process parameters, critical dimension capability and performance verification, design specifications, timing criticality, to name a few, need to be encapsulated and exchanged between the design and the manufacturing teams, connection~100 and 101, in FIG. 3. Evidently, it is not sufficient to achieve these objects by using a common data format or database amongst all the tools involved. What is needed is a platform that 1) has access to functionality of all these tools, 2) has a common user interface that allows information exchange between design and manufacturing groups, and 3) has a data structure that handle and manipulate both circuit connectivity information (required by circuit performance verifications) and silicon patterning information (required by layout enhancements).

A first object is to provide a system and a software platform for automated and integrated physical verification and manufacturing enhancement operations, so as to bridge the disconnect between the design and the manufacturing parties and to facilitate advanced integrated circuit design for manufacturability, yield and performance.

Another object of the present invention is to provide a range of physical design, verification and layout enhancement operations on a single platform, hence eliminating the need for translation of layout descriptions between different tools.

A further object of the present invention is to provide a physical verification and enhancement platform with established interfaces to existing or future verification and enhancement engines, to facilitate the exchange of data without the need for a unified database or common data file format.

A still further object of the present invention is to provide a transparent mechanism of incorporating manufacturing-specific process-related distortions and the associated corrections and enhancements early in the physical design and verification process, so that their impact on circuit manufacturability, yield and performance can be made known and accounted for by the design group.

Yet another object of the present invention is to provide a transparent mechanism of incorporating design-specific objectives and requirements in manufacturing-specific layout enhancement process, so that the design intents can be maintained under the manufacturing distortions to eliminate circuit-related yield and performance issues.

A further object of the present invention is to provide a system which permits design engineers to replicate process-specific layout enhancements to be introduced by the manufacturer and verify their impact on circuit performance.

A still further object of the present invention is to provide a system which permits manufacturing engineers to re-verify design-specific performance or yield criteria on layouts with manufacturing-specific enhancements prior to making a set of masks.

Yet another object of the present invention is to provide a system which permits the design team to tape-out with design intents, so that the manufacturing team can utilize such information to optimize layout enhancements and ensure layout manufacturability, yield and performance. These modifications would then be analyzed again by the tools focusing on the device specification to ensure compliance.

Another object of the present invention is to provide a system which permits the manufacturing team to encapsulate methodology and models used for layout enhancement generation as part of an extended design rule set, such that the design team can preemptively generate such enhancements and incorporate their impacts early.

A further object of the present invention is to provide a system which permits integrated, customizable flow of physical verification and manufacturing-related layout manipulation.

A still further object of the present invention is to provide a system which permits the use of many resolution enhancement technologies and methodologies, but does not depend on the use of specific enhancement technology, methodology and/or EDA tools.

Another object of the present invention is to provide a system for automated physical verification and enhancement which has high storage, memory and run-time efficiency.

Yet another object of the present invention is to provide a system for automated physical verification and enhancement which has a graphical, easy-to-use and an object-oriented, script-like user interfaces.

DETAILED DESCRIPTION OF PREFERRED EMBODIMENTS

Figure 1:
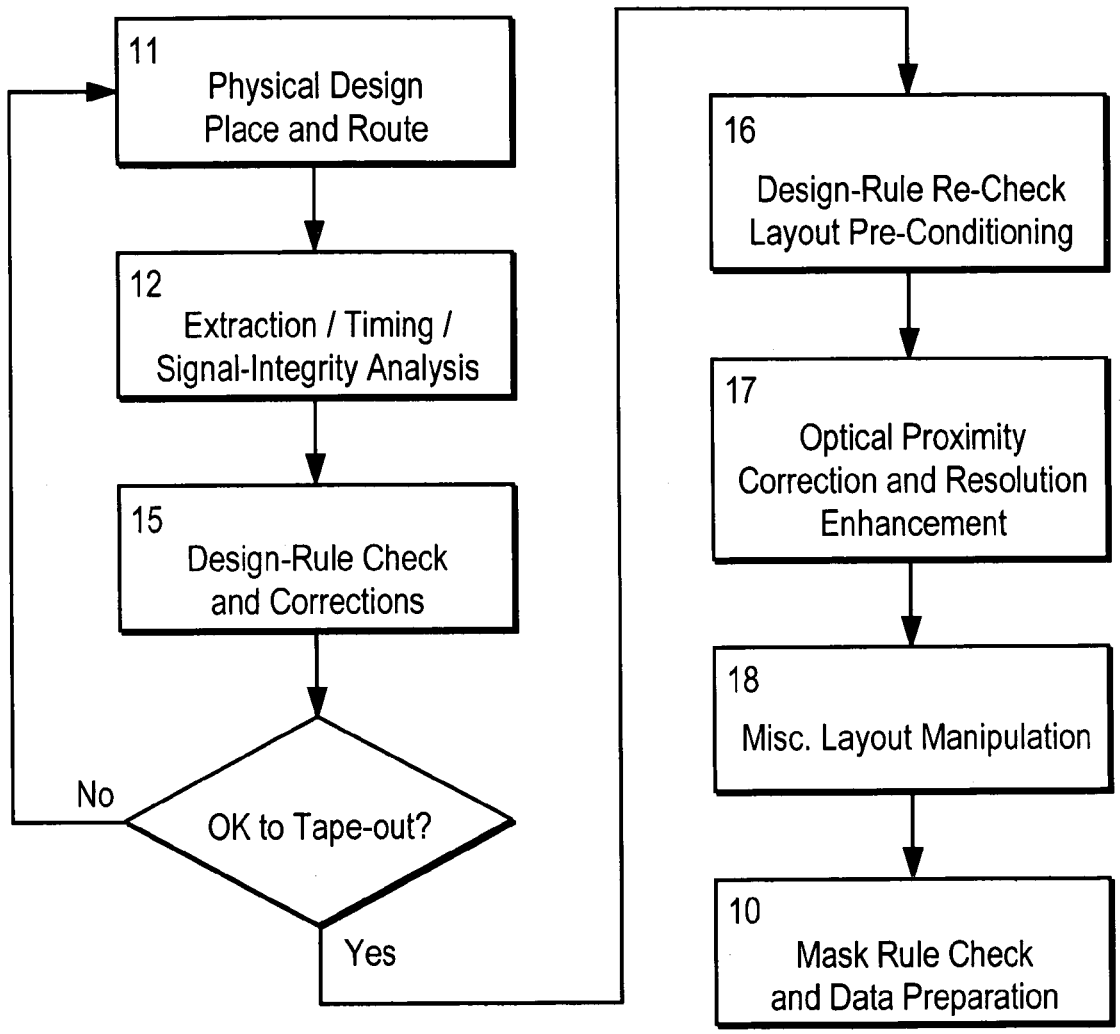
FIG. 1 Flow chart of the prior art for physical layout design to manufacturing process.

A software platform consisting of a collection of software tools functionally bound together with an underlying structure so that different tools can communicate with each other and be controlled via a unified interface to the end-user. The platform also allows the possibility of adding, modifying, removing and/or customizing its components or engines, as long as the components utilize a pre-defined set of interfaces to the platform.

A data structure that permits representations, handling and manipulations of both layout circuit connectivity and geometry patterning information. The data structure represents a set of polygons. Each polygon has a set of vertices which describe its shape and location, plus two or more pointers to link, or define an association, with other polygons. With this data structure, a layout can be "fractured" and described by a set of polygons, where the circuit connectivity are described by linking electronically-connected polygons using the so-equipped polygon pointers. The polygons that form a circuit path are linked together with the pointers and can be easily traced back and forth. Since both the layout geometry and the circuit connectivity information are stored in such a data structure, we can invoke geometric operations, such as design-rule-check and optical-proximity corrections and connectivity operations, such as extraction and timing analysis, simultaneously utilizing the geometric and the connectivity information stored together. This data structure facilitates the ability to map data derived from the circuit definition to the geometric representations; a data mapper connecting the two data blocks is created.

A set of application program interfaces to link the data structure with various, geometry, hierarchy, modeling and simulation, engines, to offer a range of physical verification and layout enhancement operations on one platform.

Different programs or engines require different types of information from the data structure. In order to integrate all the functionality provided by various engines together, it is not required to have a common data structure or database for this very reason. However, in order for the data structures employed to communicate with engines effectively, it is a must to have a set of well defined application program interfaces to interface in between the data structure(s) and the engines. For example, a DRC engine accesses only the geometric information of the layout, specifically, the spacing between and the width of various polygons; therefore, an interface is needed which allows effective neighboring searches, given a certain geometric locale, to return all polygons within the range and their geometric relationship. Once this specific interface is designed and fixed, multiple engines which require the same functionality and access the data structure using this interface, and vice versa, the same DRC engine, including layout geometry and circuit connectivity engines, can access different data structures using the same interface, A hierarchy handling strategy which permits distributed processing.

A key requirement in distributed processing is that each (sub-) job should be maintained as independent from other (sub-) jobs as possible to minimize the communications, or additional tasks, required in-between jobs. However, due to the hierarchical nature of layouts, cells may be referenced many times throughout the layout which implies inter-job dependency when the application tries to divide the layout into many smaller jobs to be distributed. Therefore, distributed processing job division, distribution and merging need to be done integrated with hierarchy handling to allow higher independence between jobs and better load balancing.

A common user interface allows access to a range of verification and enhancement functionality throughout the post-routing to manufacturing flow. One example of such interface is a scripting interface. Since all programs or engines are integrated via the platform, a universal way of engaging and controlling all the functionality is required. One example of a universal interface is a scripting interface such as tcl-based, where all commands and inputs and outputs provided by the engines can be accessed through a tcl shell.

A graphical user interface system which displays the process flow and/or the data representation in each stage in graphical forms. The graphical interface is similar to the above mentioned scripting interface, with the additional use of graphical representation of inputs and outputs from the various engines. The ability to enter data and observe changes on the circuit performance as it relates to the design goals and manufacturing yield targets is part of this module as well.

A set of application programs to generate the manufacturing models to serve as input to the platform. The various manufacturing steps such as photolithography, CVD, etching processes, chemical mechanical polishing process, etc. are modeled for yield and performance versus critical dimensions in the layout and versus number of masking steps and the associated alignment tolerances of each layer. These applications also have the capability of calibrating the models to a given set of observed process data for a particular foundry. The observed process data may be obtained from a specific set of test masks forming particular circuit components designed to test the limits of various manufacturing locations.

A method to specify design intents. The method comprises a language with a data format which allows circuit design specifications, such as criticality, timing, power, signal-integrity requirements, critical paths and modules, as well as strategies for design-for-manufacturing, etc. to be specified and to be integrated into the platform and interface tools.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Methods and apparatuses are described herein with respect to integrated circuit manufacturing; however, the techniques described can be applied to the manufacturing and/or design process of any integrated device. Integrated devices include integrated circuits, micromachines, and thin film structures such as disk drive heads, gene chips, microelectromechanical systems (MEMS), nanoscale devices or any other article of manufacture that is manufactured using lithography techniques in combination with design rules for the various stages of design and manufacture . . . .

While the preferred embodiment of the invention has been illustrated and described, it will be appreciated that various changes can be made therein without departing from the spirit and scope of the invention.

The above tools and methods provided by the present invention offer tighter integration between design-related and manufacturing-related verifications and enhancements, without the requirement of a common database. Other aspects and advantages of the present invention can be seen upon review of the figures, the detailed description and claims which follow.

DETAILED DESCRIPTION

A detailed description of the present invention is provided with respect to the figures.

Figure 3:
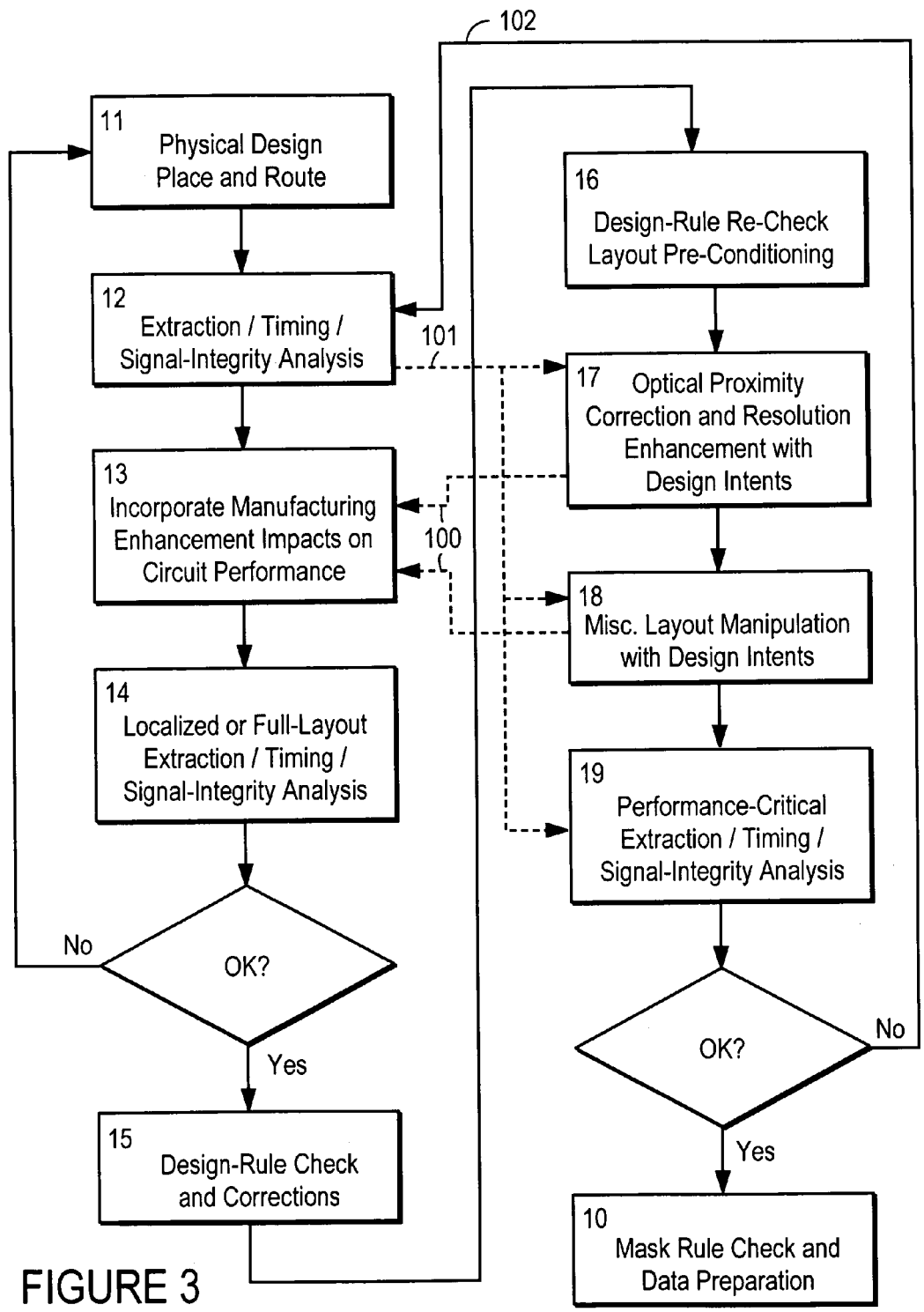
FIG. 3 Flow chart of a physical layout design to manufacturing process with information exchange between design/verification and manufacturing groups.

FIG. 3 illustrates an improved physical design and enhancement flow that bridges the above mentioned disconnect. Comparing to FIG. 1, the improved flow has three new steps (step 13, 14 and 19) and some information exchanges between the design and the manufacturing entities (connection 100 and 101). Right after the conventional circuit performance analysis (step 12), a new step is introduced (step 13) to preemptively replicate some of the layout enhancements to be introduced using information provided by the manufacturing team (connection~100). Next, proper performance and yield verification can then be performed (step 14) incorporating the impacts of manufacturing distortions and enhancements. On the other hand, within the manufacturing group, layout enhancements (step 17 and 18) can then be performed with design intents in mind utilizing information provided by the design team (connection 101). Moreover, critical paths and modules can be re-verified for performance and yield (step 19). Should the verification results not achieve the minimum design goal or performance standard, the design team can resolve the problems (loop 102) to prevent expensive and time-consuming mask fabrication and IC production of sub-optimum product.

Figure 4:
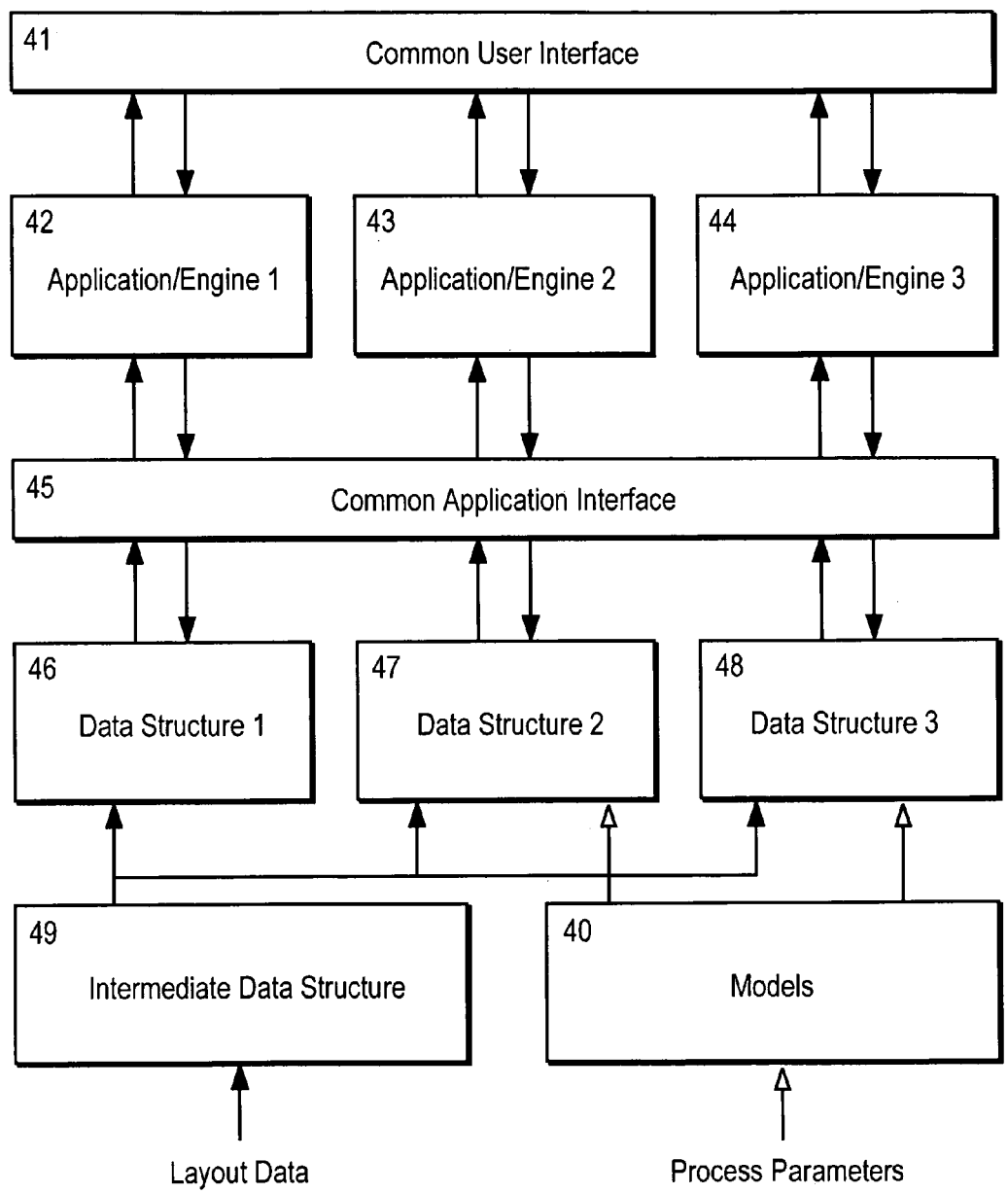
FIG. 4 Architecture of an integrated physical verification and enhancement platform.

FIG. 4 illustrates an architecture that supports the invented platform. The goal of the invention is to provide a wide range of verification and enhancement operations and to maintain operation and storage efficiency throughout the flow. This is achieved with multiple data structures for various operations, all data structures are not active simultaneously. In this architecture, manufacturing process information is mapped into various models (box 40) and raw layout data is mapped into an efficient intermediate data structure (box 49). Pending on the type of operation to be performed, the intermediate data is mapped into one of the optimized data structures for a specific application (box 46 to 48). A common application program interface (box 45) serves as the communication interface between various application engines (boxes 42 to 44) and the data, which ensures the access of all applications and data throughout the whole flow. A common user interface (box~41) sits on top on the applications to allow universal control and information access.

Figure 2A:
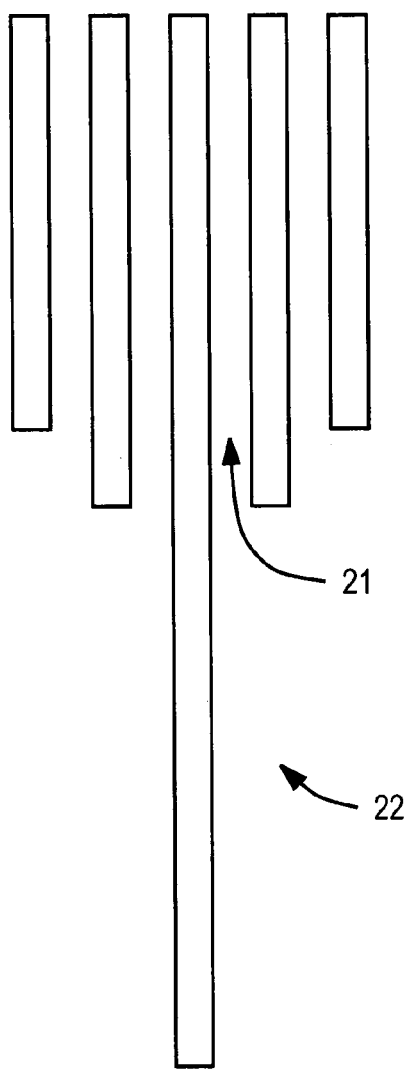
FIGS. 2A and 2B Illustrations of various layout enhancements.
Figure 2B:
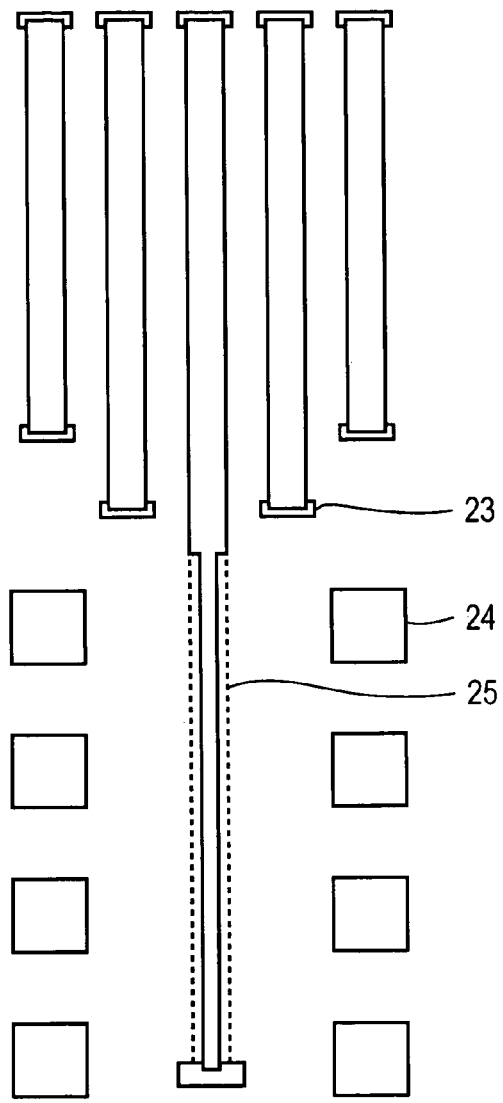
Figure 5:
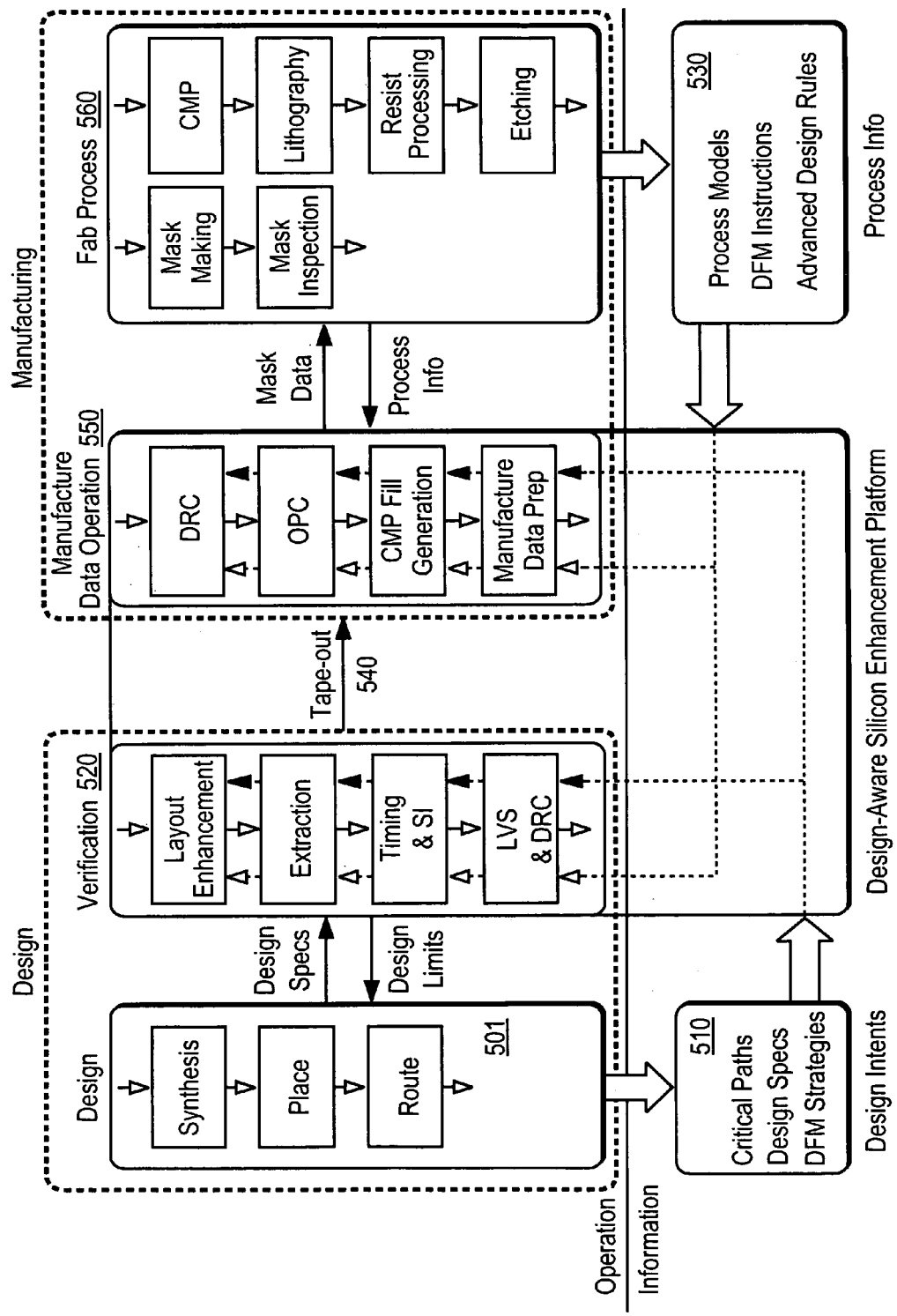
FIG. 5 Detailed hardware/software configuration of physical design to manufacturing flow.

FIG. 5 illustrates the detailed flow from design to silicon preparation and the operations performed by the platform in FIG. 2. After the routing stage, (501), a set of design intents including critical paths, design specifications, and DFM strategies (510) are captured and passed to the physical verification components (520) in the platform. At the same time, since the manufacturing models encapsulating manufacturing processes (530) including process models, DFM instructions, and advanced design rules are available, the physical verification components make use of the manufacturing related models and perform checking and enhancement on the post-routing layout for tape-out. When manufacturers receive the layout (540) along with the design intents (510), the manufacturer can make use of the manufacturing models (530, 550, 560) and use the platform to modify the taped-out layout to enhance manufacturability, and verify the modified layout according to the design-intents (510) before mask making.

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

We claim:

1. A computer-implemented method of generating a layout for an integrated circuit, the computer-implemented method comprising:
   generating a layout based on a physical design of the integrated circuit;
   performing a first circuit performance analysis on the layout;
   incorporating manufacturing enhancements on the layout, the manufacturing enhancements including optical proximity correction;
   performing a second circuit performance analysis on the layout using the layout with the manufacturing enhancements incorporated therein to generate a taped-out layout of the integrated circuit;
   checking design-rules on the taped-out layout;
   modifying the taped-out layout by performing the manufacturing enhancements on the taped-out layout using at least in part results of the first circuit performance analysis; and
   performing a third circuit performance analysis on the modified taped-out layout with the manufacturing enhancements included therein to generate a final layout to be used in manufacturing of masks for fabrication of the integrated circuit.

* * * * *